United States Patent
Wang et al.

[11] Patent Number: 5,989,938
[45] Date of Patent: Nov. 23, 1999

[54] METHOD OF FABRICATING TOPSIDE STRUCTURE OF A SEMICONDUCTOR DEVICE

[75] Inventors: Hsingya Arthur Wang, Saratoga; Bandali B. Mohamed, Los Gatos, both of Calif.; Shyam Garg, Austin; Bruce Pickelsimer, Pflugerville, both of Tex.

[73] Assignee: Advanced Micro Devices, Inc., Sunnyvale, Calif.

[21] Appl. No.: 08/926,583

[22] Filed: Sep. 4, 1997

Related U.S. Application Data

[62] Division of application No. 08/579,757, Dec. 28, 1995, Pat. No. 5,728,453.

[51] Int. Cl.[6] ............ H01L 21/44; H01L 21/48; H01L 21/00; H01L 21/31
[52] U.S. Cl. ................ 438/116; 438/791; 438/64
[58] Field of Search ................. 438/116, 791, 438/64

[56] References Cited

U.S. PATENT DOCUMENTS

| | | | |
|---|---|---|---|
| 4,618,541 | 10/1986 | Forouhi et al. | 428/688 |
| 4,775,550 | 10/1988 | Chu et al. | 427/38 |
| 4,965,226 | 10/1990 | Gootzen et al. | 437/189 |
| 5,217,926 | 6/1993 | Langley | 437/228 |
| 5,527,872 | 6/1996 | Allman | 528/12 |

OTHER PUBLICATIONS

Wolf, S.; Silicon Processing for the VLSI Era, vol. 2; Lattice Press, Sunset Beach, Ca.; pp. 273–276, 1990.

*Primary Examiner*—John F. Niebling
*Assistant Examiner*—Neal Berezny
*Attorney, Agent, or Firm*—Skjerven, Morrill, MacPherson, Franklin and Friel; Edward C. Kwok

[57] ABSTRACT

The present method and apparatus provides a thin layer of oxynitride over a device including a patterned metal layer, application of a planarizing SOG layer over the thin oxynitride layer, removal of thin portions of the SOG layer by etching to expose portions of the thin oxynitride layer, and application of a thick oxynitride layer to form a strong bond with the thin oxynitride layer. A thin nitride layer, transparent to UV light, may then be applied to the resulting structure prior to application of plastic packaging material.

7 Claims, 2 Drawing Sheets

METHOD OF FABRICATING TOPSIDE STRUCTURE OF A SEMICONDUCTOR DEVICE

This application is a division of application Ser. No. 08/579,757, filed Dec. 28, 1995, now U.S. Pat. No. 5,728,453.

FIELD OF THE INVENTION

This invention relates to semiconductor technology, and more particularly, to the fabrication of a UV-transparent topside of a semiconductor device.

BACKGROUND OF THE INVENTION

A typical erasable semiconductor memory cell is erasable by application of ultraviolet (UV) light thereto. In furtherance thereof, the cell is covered by a topside structure which is transparent to UV light. Such a topside structure of a prior art device is shown in FIG. 1.

A silicon substrate 10 is provided which incorporates typical memory cell structure (not shown) which may be erased by application of UV light thereto. The substrate has provided thereover field oxide ($SiO_2$) 12 and a layer of BPSG or BPTEOS glass 14. An aluminum layer 16 is patterned over the resulting structure. A relatively thin silicon oxynitride [$SiO_xN_y(H_z)$] layer 18 is provided over the metal layer 16 in conformance therewith, so that the oxynitride layer 18 is in contact with the metal layer 16, and the glass layer 14, and also, at the edge of the die, the substrate 10. In order to planarize the device, spin-on-glass (SOG) 20 is provided over the resulting structure, substantially filling in the recesses of the structure. The thin oxynitride layer 18 is included to keep the SOG 20 from attacking and reacting with the aluminum, thereby acting as a barrier therebetween. During the planarization step, a very thin layer of SOG 20A, approximately 100 Å thick, is applied to and remains over portions of the thin oxynitride layer 18.

Then, a relatively thick oxynitride layer 22, approximately 12000 Å thick, is provided over the resulting structure, and plastic packaging material 24 is provided over the oxynitride layer.

Although this structure achieves relatively smooth topology, a crack may occur in the SOG layer for example at 26 near the edge of the die and may spread through and along the thin SOG layer 20A. Since the thermal expansion coefficient of the plastic material 24 is much greater than that of the material below it, the plastic material 24 expands and contracts much more than the lower structure for a given change in temperature. The adhesion between the thin SOG 20A and the oxynitride layer 22 is relatively weak, while the adhesion between that oxynitride layer 22 and the plastic packaging material 24 is relatively strong. Thus, under change in temperature, cracking can readily occur as described above in and along the thin SOG 20A. Such a crack can extend through the thick oxynitride layer 22 as at 28 because of its relatively poor physical strength. Thus, a device as thus far described may be readily prone to failure.

SUMMARY OF THE INVENTION

The present invention incorporates features which overcome the above-cited problems. In furtherance thereof, after application of a patterned aluminum layer, thin oxynitride layer and SOG layer, the thin portions of the SOG layer are removed by etching. Then, when a thick oxynitride layer is applied to the resulting device, such thick oxynitride layer is in direct contact with the thin oxynitride layer portions overlying the metal, and strongly bonds therewith.

In addition, a very thin silicon nitride ($Si_3N_4$) layer (sufficiently thin to allow UV light to pass therethrough) with advantage may be applied over the thick oxynitride layer. The bond between the nitride layer and the plastic material is weaker than the bond between the thick oxynitride layer and plastic material, so that if a crack was to occur, the crack would be between the nitride layer and the plastic packaging material. Once such a crack occurs, continued expansion and contraction of the overall structure will not be a problem, i.e., the integrity of the plastic material and the integrity of the thick oxynitride layer will remain.

BRIEF DESCRIPTION OF THE DRAWINGS

Shown in FIG. 1 is a sectional view of a typical prior art device of the type described.

DESCRIPTION OF THE PREFERRED EMBODIMENT

Figure 1:
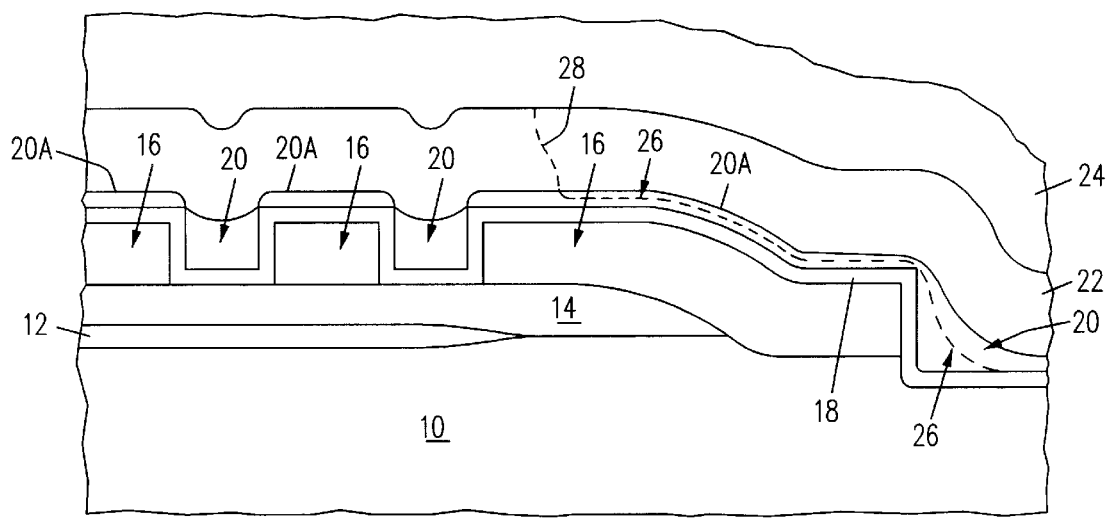
Figure 2:
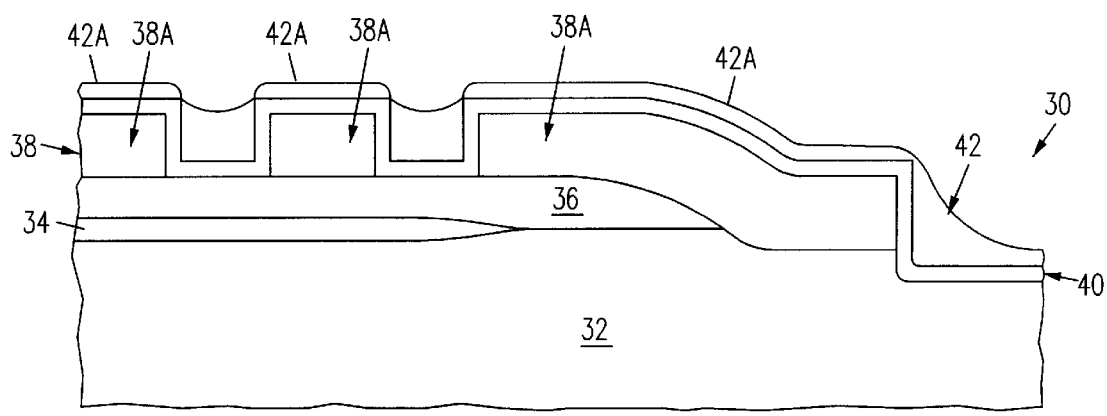
FIG. 2 is a sectional view of a device at a process step earlier than that shown in FIG. 1 for illustration of the present invention.

Reference is made to FIG. 2, showing a cross section of a device 30 incorporating a number of elements and process steps of the device shown in FIG. 1.

As shown in FIG. 2, a silicon substrate 32 is provided, incorporating memory cell structure (not shown) which is erasable by application of UV light. The substrate 32 has thereon a field oxide region 34 and a glass region 36. An aluminum layer 38 is provided over the resulting structure and is patterned into portions 38A as shown in FIG. 2. Next, a thin layer of oxynitride 40, between 100 Å and 5000 Å thick, and preferably 3000 Å thick, is provided over the resulting structure, and a layer of SOG 42 is provided over the resulting structure, to fill in recesses adjacent sides of the metal layer portions 38A, all as described above. Also as described above, the SOG 42 has very thin portions 42A, approximately 100 Å thick, over the portions of the thin oxynitride layer 40 atop the metal layer portions 38A. Then, using Reactive Ion Etch (RIE) or plasma etch, the SOG layer 42 is etched to remove the thin portions 42A thereof, exposing portions of the thin oxynitride layer 40, but with the recesses remaining substantially filled with SOG, so that good device planarization can be achieved.

Figure 3:
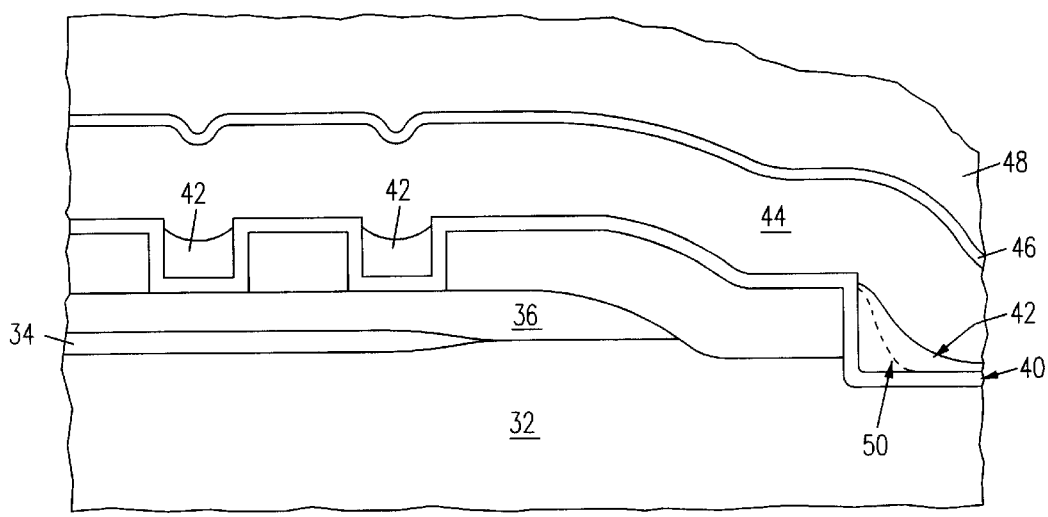
FIG. 3 is a sectional view of a device fabricated in accordance with the present invention.

A thick layer of oxynitride 44 (FIG. 3), for example with advantage greater than 12000 Å thick, is provided over the resulting structure, whereby excellent bonding is achieved between oxynitride layer 44 and oxynitride layer 40 where they contact. Then, a very thin nitride layer 46 is provided over the oxynitride layer 44. The nitride material may be of the type which, if sufficiently thick, would not allow UV light to pass therethrough, but if used in such a thin state, allows UV light therethrough for proper erasure use of a cell. The thin nitride layer 46 is chosen to be less than 2000 Å, i.e., for example, 670 Å or 1340 Å thick, which corresponds to a half or full wavelength of UV light.

Finally, plastic packaging material 48 is applied to the nitride layer 46.

Each of the materials beneath the plastic material 48 has a roughly similar thermal coefficient of expansion, while the thermal coefficient of expansion of the plastic material 48 is much higher than the material below. Because the thin layer of SOG between oxynitride layers 40, 44 is avoided, a strong bond is provided therebetween and these oxynitride layers 40, 44 readily expand and contract together. That is, cracks generated at the edge of the die as at 50 will not spread into the area previously indicated, because a strong bond is created between the oxynitride layers 40, 44, which have the same coefficient of thermal expansion.

In addition, the increase in thickness of the oxynitride layer 44 to greater than 12000 Å, i.e., for example, 18000 Å, adds to the overall strength of the device. Furthermore, as previously described, inclusion of the thin nitride layer 46 between the oxynitride layer 44 and the plastic packaging material 48 provides a relatively weak bond therebetween to allow for the much greater thermal coefficient of expansion of the plastic material 48 than the material therebelow.

We claim:

1. A method of fabricating a semiconductor device comprising:

providing a base structure;

providing a patterned metal layer over the base structure;

providing a first oxynitride layer over the resulting structure, so that the first oxynitride layer defines a recess adjacent a side portion of the metal layer;

providing spin-on-glass (SOG) over the resulting structure, so that said recess contains SOG, and a layer of SOG is provided on a remaining surface portion of the first oxynitride layer;

removing the layer of SOG from the remaining surface portion of the first oxynitride layer;

providing a second oxynitride layer over the resulting structure; and providing a nitride layer over said second oxynitride layer, said nitride layer being sufficiently thin to allow ultra-violet radiation to transmit therethrough.

2. The method of claim 1 and further comprising the step of providing plastic material over the second oxynitride layer.

3. The method of claim 1 and further comprising the step of providing plastic material over the nitride layer.

4. The method of claim 1, wherein the step of removing the layer of SOG comprises the step of etching the SOG sufficiently to remove the SOG from those portions of the first oxynitride layer overlying said patterned metal layer.

5. The method of claim 1, wherein said nitride layer is less than 2000 Å.

6. The method of claim 1, wherein said nitride layer has a thickness in the range of 670 Å to 1340 Å.

7. The method of claim 1, wherein said nitride layer has a thickness in the range of one-half wavelength and a full wavelength of a predetermined electromagnetic radiation.

* * * * *